United States Patent [19]

Nakashiba

[11] Patent Number: 5,442,396
[45] Date of Patent: Aug. 15, 1995

[54] SOLID-STATE IMAGE PICKUP DEVICE WHEREIN PLURAL POWER FEEDING WIRES SERVE AS A LIGHT-SHIELD FILM

[75] Inventor: Yasutaka Nakashiba, Tokyo, Japan
[73] Assignee: NEC Corporation, Tokyo, Japan
[21] Appl. No.: 291,539
[22] Filed: Aug. 16, 1994

[30] Foreign Application Priority Data

Aug. 26, 1993 [JP] Japan .................. 5-234014

[51] Int. Cl.$^6$ ............................................ H04N 5/335
[52] U.S. Cl. ................................ 348/322; 348/320
[58] Field of Search ............... 348/294, 320, 321, 322, 348/323, 324, 311; 257/217, 223, 228, 230, 232, 249; H04N 5/395

[56] References Cited

U.S. PATENT DOCUMENTS 5,274,476 12/1993 Lee ....................................... 348/320
5,353,057 10/1994 Natanabe ............................ 348/322

OTHER PUBLICATIONS

"Frame Interline Transfer CCD Sensor for HDTV Camera", 1989 IEEE International Solid–State Circuits Conference, Paper No. WPM 8.1, pp. 88–89, Feb. 15, 1989, by Toshihida Nobusada et al.

Primary Examiner—Joseph Manchso
Assistant Examiner—Tuan V. Ho
Attorney, Agent, or Firm—Young & Thompson

[57] ABSTRACT

In a solid-state image pickup device comprising a plurality of photoelectric converting sections, vertical charge transfer sections each comprising first and second vertical charge transfer electrodes (26a, 26b) and a vertical charge transfer region (23), and power feeding sections, each of the power feeding sections is divided into first through fourth metal wires (28a, 28b, 28c, 28d). The first through the third metal wires (28a, 28b, 28c) are formed in a first layer of a conductive film. The fourth metal wire (28d) is formed in a second layer of the conductive film. The first and the third metal wires (28a, 28c) are alternately connected to the first vertical charge transfer electrodes (26a) via contact holes (27). The second and the fourth metal wires (28b, 28d) are alternately connected to the second vertical charge transfer electrodes (26b) via contact holes (27). The first through the fourth metal wires (28a, 28b, 28c, 28d) are applied with first through fourth clock pulse signals ($\phi 1$, $\phi 2$, $\phi 3$, 100 4), respectively, which are different in phase from one another. The first and the third metal wires (28a, 28c) only light-shield areas between the photoelectric converting sections and vertical charge transfer regions.

11 Claims, 9 Drawing Sheets

SOLID-STATE IMAGE PICKUP DEVICE WHEREIN PLURAL POWER FEEDING WIRES SERVE AS A LIGHT-SHIELD FILM

BACKGROUND OF THE INVENTION

This invention relates to a solid-state image pickup device for use in picking up image and, more particularly, to a solid-state image pickup device comprising power feeding wires, which serve as light-shield films, for supplying clock pulses to charge transfer electrodes provided along columns of photoelectric converting sections.

In comparison with image pickup tubes generally used in prior art, solid-state image pickup devices are superior in small-sized, lightweight, high durability, low power consumption, low afterimage, low burning, and so on. As a result, the solid-state image pickup devices already surpass the image pickup tubes in a camera field for public use where movie cameras have small image size. Furthermore, the solid-state image pickup devices replace in a camera field for business use where cameras have relatively large image size.

Solid-state image pickup devices for a high-definition television (HDTV) are typical of the solid-state image pickup devices having the relatively large image size, for example, solid-state image pickup devices having an optical size of one inch or two-thirds inches. In such solid-state image pickup devices, driving pulses are generally supplied to transfer electrodes of polysilicon in both sides of an image region. The transfer electrodes of polysilicon are commonly disposed in all of one horizontal line. In the solid-state image pickup devices of such a driving pulse supplying method, the transfer electrodes of polysilicon have relatively high resistance and relatively high capacitance. As a result, such solid-state image pickup devices are disadvantageous in that pulse amplitude of the driving pulses remarkably decreases in a central portion of the image region and the amount of maximum transferring charges decreases especially when a transfer speed is fast.

In order to overcome the above-mentioned disadvantage, proposal has been made by Toshihida Nobusada et al in a paper submitted to "1989 IEEE International Solid-State Circuits Conference" as Paper No. WPM 8.1, pages 88–89, Feb. 15, 1989 under the title of "Frame Interline Transfer CCD Sensor for HDTV Camera."

The solid-state image pickup device of an interline transfer type generally comprises photoelectric converting sections for converting incident light into signal charges, vertical charge transfer sections for reading the signal charges out of the photoelectric converting sections as read charges to transfer the read charges along a vertical direction as vertical transferred charges, a horizontal charge transfer section for receiving the vertical transferred charges from the vertical charge transfer sections horizontal line by horizontal line as received charges to transfer along a horizontal direction as horizontal transferred charges, and an output circuit section for converting the horizontal transferred charges into a voltage signal. Those components are isolated from one another by element isolation sections.

In a conventional solid-state pickup device disclosed by Nobusada et al, a p-type well layer is formed in an n-type semiconductor substrate. The p-type well layer has a surface area in which the photoelectric converting sections, charge transfer regions of the vertical transfer sections, and element isolation sections are formed. Each of the photoelectric converting sections consists of an n-type semiconductor region and a $p^+$-type semiconductor region. Each of the charge transfer regions consists of an n-type semiconductor region. The element isolation sections comprises $p^+$-type semiconductor regions. On those regions through an insulation film, a plurality of transfer electrodes of the vertical charge transfer sections and a plurality of power feeding wires are formed. The transfer electrodes are made of polycrystalline silicon and are classified into first and second vertical charge transfer electrodes. The power feeding wires are classified into first through fourth metal wires. The power feeding wires supply clock pulses to the transfer electrodes and serve as light-shield films. The first through the fourth metal wires are formed by a single layer.

The first through the fourth metal wires are formed every four vertical charge transfer sections and are connected to the transfer electrodes through contact holes. The first and the second vertical charge transfer electrodes are adjacent to picture elements in one horizontal line in common and connected to the power feeding wires every four picture elements along a horizontal direction.

The conventional solid-state image pickup device is driven by applying the clock pulses of first through fourth clock pulse signals to the first through the fourth metal wires, respectively. The vertical charge transfer electrodes are supplied with reading pulses having high voltage through the second and the fourth metal wires, whereby reading of the signal charges is carried out from the photoelectric converting sections to the vertical charge transfer sections.

Inasmuch as the first through the fourth metal wires serves as the light-shield films, they extend on the photoelectric converting sections with passing the second vertical charge transfer electrodes. As a result, the reading pulse having the high positive voltage is supplied to the second vertical charge transfer electrodes via the second or the fourth metal wires, the $p^+$-type semiconductor regions deplete to form a local potential well, which results in degradation of a readout characteristic of the signal charges.

When the local potential well is minimized by narrowing the amount of overlapping between the second and the fourth metal wires and the photoelectric converting sections, smear characteristic degrades because spurious signal charges flowing the vertical charge transfer sections increase.

Inasmuch as it is necessary for the conventional solid-state image pickup device to connect the first and the second vertical charge transfer electrodes between the adjacent photoelectric converting sections in the vertical direction by first and second connecting electrode lines, respectively, the first and the second connecting electrode lines must be laminated to each other at laminated areas. As a result, large capacitance is formed between the first and the second vertical charge transfer electrodes. In addition, capacitance is formed at the laminated area between the n-type semiconductor substrate and the first charge transfer electrodes. As a result, bluntness of waveform of the clock pulses occurs, which results in degradation of transfer characteristic for the vertical charge transfer sections.

SUMMARY OF THE INVENTION

It is therefore an object of this invention to provide a solid-state image pickup device which can improve a readout characteristic for signal charges from photoelectric converting sections without degradation of a smear characteristic.

It is another object of this invention to provide a solid-state image pickup device of the type described, which can improve a transfer characteristic for vertical charge transfer sections by reducing capacitance between vertical charge transfer electrodes and between a semiconductor substrate and the vertical charge transfer electrodes.

Other objects of this invention will become clear as the description proceeds.

According to an aspect of this invention, a solid-state image pickup device comprises a plurality of photoelectric converting sections arranged in the configuration of a matrix with m rows and n columns where m and n represent first and second positive integers each of which is not less than two. Responsive to incident light, the photoelectric converting sections accumulate electric charges as signal charges. At one sides of the n columns of the photoelectric converting sections, n vertical charge transfer sections are adjacent to the n columns of the photoelectric converting sections. Each of the n vertical charge transfer sections extends along a vertical direction. The n vertical charge transfer sections are for reading the signal charges out of the photoelectric converting sections as read charges to transfer the read charges along the vertical direction as transferred charges. Each of the vertical charge transfer sections comprises a plurality of vertical charge transfer electrodes and a vertical charge transfer region formed beneath the vertical charge transfer electrodes. On the n vertical charge transfer sections, n transferring wires are disposed, respectively. The transferring wires serve as light-shield films for shielding the vertical charge transfer sections from the incident light. The transferring wires are for supplying vertical transferring clocks to the vertical charge transfer electrodes to make the n vertical charge transfer sections transfer the readout charges along the vertical direction as the transferred charges. The n transferring wires light-shield areas between the photoelectric converting sections and the vertical charge transfer regions. On the n vertical charge transfer sections, n reading/transferring wires are disposed, respectively. The n reading/transferring wires serve as light-shield films for shielding the vertical charge transfer sections from the incident light. The n reading/transferring wires are for supplying readout pulses and vertical transferring clocks to the vertical charge transfer electrodes to make the vertical charge transfer sections read the signal charges from the photoelectric converting sections to the vertical charge transfer regions as the readout charges and to make the n vertical charge transfer sections transfer the readout charges along the vertical direction as the transferred charges.

DESCRIPTION OF THE PREFERRED EMBODIMENTS

Figure 1:
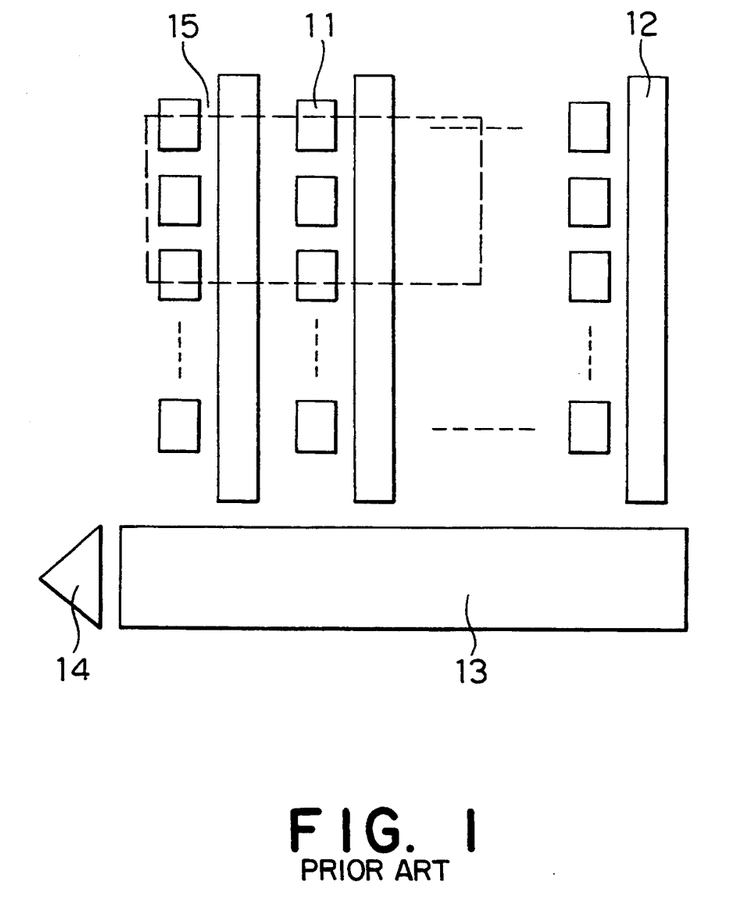
FIG. 1 is a schematic plan view of a general solid-state image pickup device.

Referring to FIG. 1, a general solid-state image pickup device will be described at first in order to facilitate an understanding of the present invention. The device is called a CCD solid-state image pickup device of interline transfer (ILT) type.

In FIG. 1, the device comprises a plurality of photoelectric converting sections 11, such as photodiodes, arranged in the configuration of a matrix with m rows and n columns, where m and n represent first and second positive integers each of which is not less than two. For simplified description, it is assumed that the first positive integer m is an even number and the second positive integer n is a multiple of four. The m rows of the photoelectric converting sections 11 are disposed with a horizontal space left between the adjacent photoelectric converting sections 11 in a vertical direction. Likewise, the n columns of the photoelectric converting sections 11 are disposed with a vertical space left between the adjacent photoelectric converting sections 11 in a horizontal direction. The photoelectric converting sections 11 accumulate, in response to incident light, electric charges as signal charges. The photoelectric converting sections 11 correspond to picture elements or pixels, respectively. The device further comprises n vertical charge transfer sections 12 adjacent to the n columns of the photoelectric converting sections 11 at one sides thereof. Each of the n vertical charge transfer sections 12 extends along the vertical direction and is arranged in the vertical space between the photoelectric converting sections 11. In the manner which will later become clear, each of the n vertical charge transfer sections 12 comprises a vertical charge transfer region and a plurality of vertical charge transfer electrodes. The n vertical charge transfer sections 12 read the signal charges out of the photoelectric converting sections 11 in the respective n columns as read charges to transfer the read charges along the vertical direction as vertical transferred charges. A horizontal charge transfer section 13 is connected to one ends of the n vertical charge transfer sections 12. The horizontal charge transfer section 13 extends along the horizontal direction. The horizontal charge transfer section 13 receives the vertical transferred charges from the n vertical charge transfer sections 12 horizontal line by horizontal line as received charges to transfer the received charges along the horizontal direction as horizontal transferred charges. An output circuit section 14 is connected to an end of the horizontal charge transfer section 13. The output circuit section 14 receives the horizontal transferred charges to convert the horizontal transferred charges into a voltage signal. Those components are isolated from one another by a plurality of element isolation sections 15.

Figure 2:
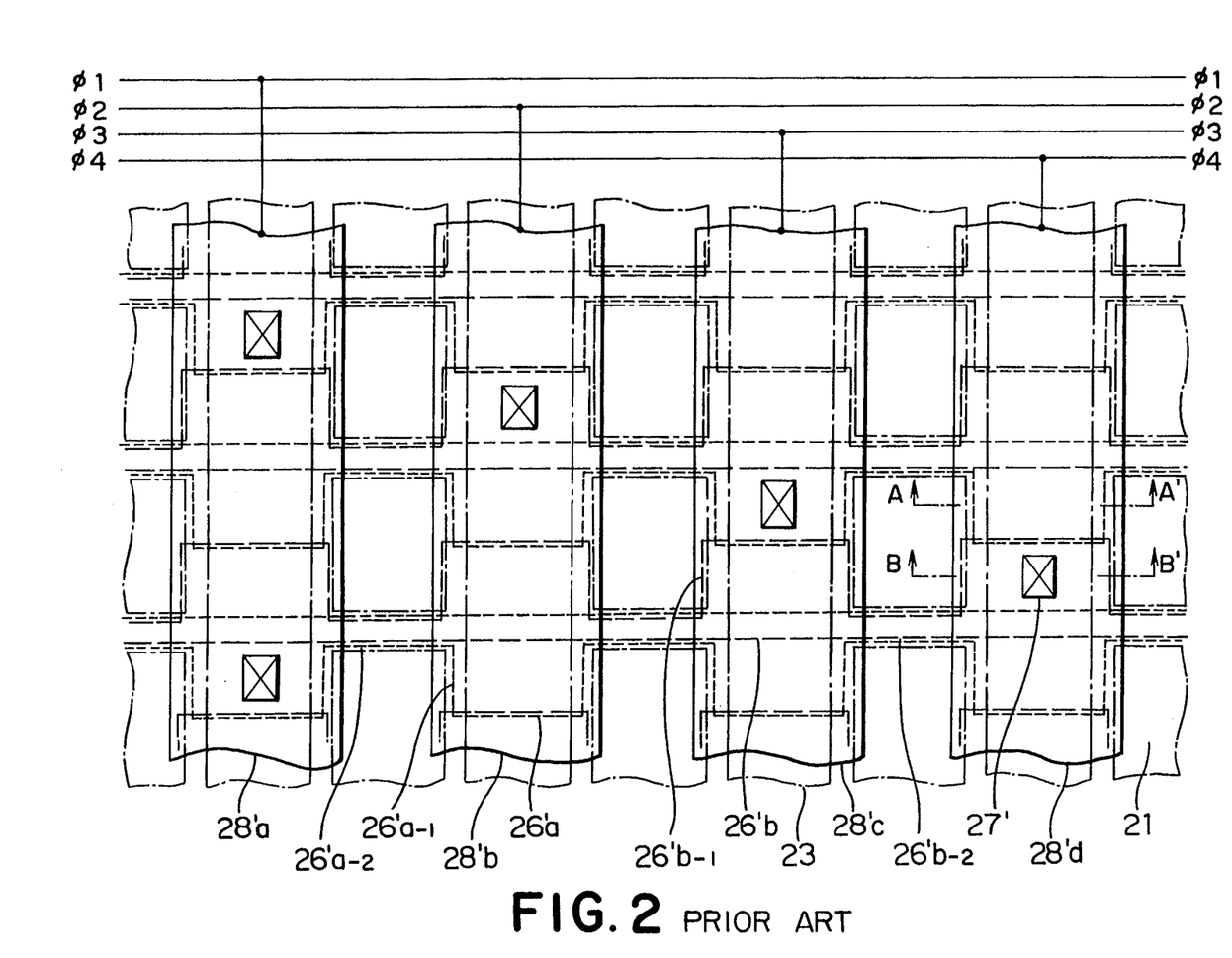
FIG. 2 is a plan view showing a part of a conventional solid-state image pickup device that is a portion enclosed with a dash line in FIG. 1.
Figure 3A:
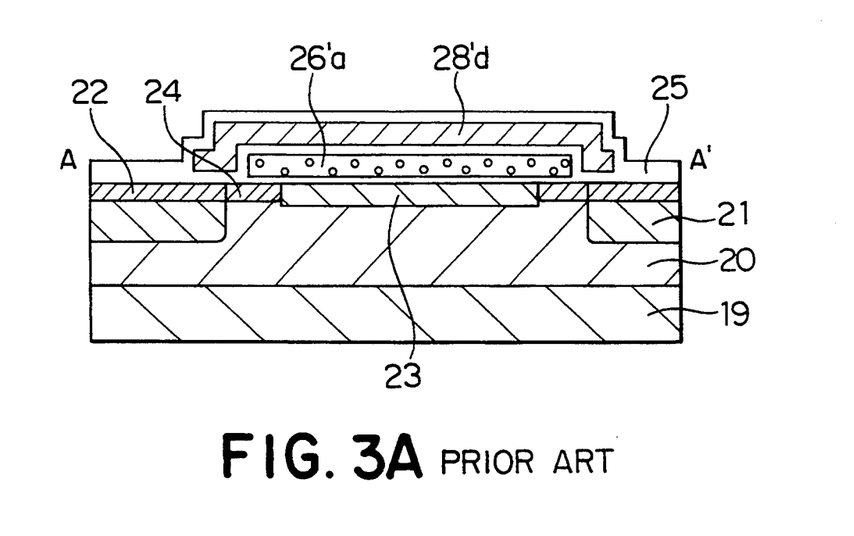
FIGS. 3A and 3B are cross-sectional views along line A—A' and line B—B' in FIG. 2, respectively.
Figure 3B:
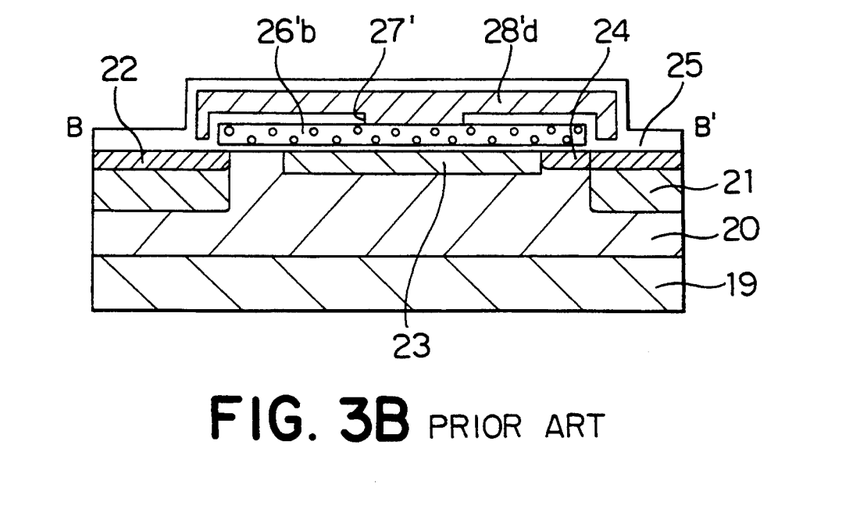

Referring to FIG. 2 and FIGS. 3A and 3B, the description will proceed to a conventional solid-state image pickup device. The device is of four phase driving type which uses technique described in the above-mentioned document. FIG. 2 is a plan view showing a part of image regions that is a portion enclosed with a dash line in FIG. 1. FIGS. 3A and 3B are cross-sectional views along line A—A' and line B—B' on FIG. 2, respectively.

As shown in FIGS. 3A and 3B, the conventional solid-state image pickup device comprises an n-type semiconductor substrate 19. The n-type semiconductor substrate 19 is prepared in a known manner and has the principal surface which is directed upwards of FIGS. 3A and 3B. On the principal surface of the n-type semiconductor substrate 19, a p-type well layer 20 having a surface area is formed. In the surface area of the p-type well layer 20, m by n n-type semiconductor regions 21, m by n p+-type semiconductor regions 22, n n-type semiconductor regions 23, and a plurality of p+-type semiconductor regions 24 are formed. The m by n n-type semiconductor regions 21 and the m by n p+-type semiconductor regions 22 collectively act as the m by n photoelectric converting sections 11 (FIG. 1). The n n-type semiconductor regions 23 serve as the n vertical charge transfer regions of the n vertical charge transfer sections 12 (FIG. 1). The p+-type semiconductor regions 24 are composed of the element isolation sections 15 (FIG. 1). As shown in FIGS. 3A and 3B, the n n-type semiconductor regions 23 are surrounded with the p+-type semiconductor regions 24 and/or the surface area of the p-type well layer 20.

As shown in FIG. 2 and FIGS. 3A and 3B, over the surface area of the p-type well layer 20, over the m by n p+-type semiconductor regions 22, over the n n-type semiconductor regions 23, and over the p+-type semiconductor regions 24, m sets of first and second vertical charge transfer electrodes 26′a and 26′b and (n/4) groups of first, second, third, and fourth metal wires 28′a, 28′b, 28′c, and 28′d are formed through an insulation film 25. Each first vertical charge transfer electrode 26?a is indicated by an area enclosed with a dashed line (--). Each of second vertical transfer electrode 26′b is indicated by an area enclosed with a broken line (---). The m sets of first and second vertical charge transfer electrodes 26′a and 26′b are made of polycrystalline silicon and composed of the vertical charge transfer electrodes of the n vertical charge transfer sections 12 (FIG. 1). The n n-type semiconductor regions 23 are formed beneath the first and the second vertical charge transfer electrodes 26a and 26b. In the manner which will later become clear, the (n/4) groups of the first through the fourth metal wires 28′a to 28′d supply clock pulses to the m sets of the first and the second vertical charge transfer electrodes 26′a and 26′b and serve as light-shield or photo-shield films for shielding the n vertical charge transfer sections 12 from the incident light. Each of the first through the fourth metal wires 28′a to 28′d is called a power feeding section.

As shown in FIGS. 3A and 3B, the first vertical charge transfer electrode 26′a is apart from the corresponding photoelectric converting section 11 in the horizontal direction while the second vertical charge transfer electrode 26′b extends near the corresponding photoelectric converting section 11 in the horizontal direction.

As shown in FIG. 2, the (n/4) groups of the first through the fourth metal wires 28′a to 28′d are formed by a single layer of conductive film and are formed on every four vertical charge transfer sections 12, respectively. The (n/4) groups of the first and the third metal wires 28′a and 28′c are connected to the m sets of the first vertical charge transfer electrodes 26′a through contact holes 27′ while the (n/4) groups of the second and the fourth metal wires 28′b and 28′d are connected to the m sets of the second vertical charge transfer electrodes 26′b through contact holes 27′, as shown in FIG. 3B. Each of the first and the second vertical charge transfer electrodes 26′a and 26′b extends along the horizontal direction and is adjacent to n photoelectric converting sections 11 or n picture elements in one horizontal line in common. In particular, the first vertical charge transfer electrode 26′a comprises a cluster of n first transfer electrode elements 26′a-1 disposed in the respective n vertical charge transfer sections 12 and a first connecting electrode line 26′a-2 for extending along the horizontal direction. The first connecting electrode line 26′a-2 connects the cluster of the n first transfer electrode elements 26′a-1 with one another via the horizontal space between the adjacent photoelectric converting sections 11 in the vertical direction. Similarly, the second vertical charge transfer electrode 26′b comprises a cluster of n second transfer electrode elements 26′b-1 disposed in the respective n vertical charge transfer sections 12 and a second connecting electrode line 26′b-2 for extending the horizontal direction. The second connecting electrode line 26′b-2 connects the cluster of the n second transfer electrode elements 26′b-1 with one another via the above-mentioned horizontal space. As a result, the first connecting electrode line 26′a-2 of the first vertical charge transfer electrode 26′a is overlapped with the corresponding second connecting electrode line 26′b-2 of the second vertical charge transfer electrode 26′b as shown in FIG. 2.

The cluster of the n first transfer electrode elements 26′a-1 of the first vertical charge transfer electrode 26′a is connected to either ones of the first and the third metal wires 28′a and 28′c every four picture elements in the horizontal direction while the cluster of the n second transfer electrode elements 26′b-1 of the second vertical charge transfer electrode 26′b is connected to either ones of the second and the fourth metal wires 28′b and 28′d every four picture elements in the horizontal direction. As a result, it is possible to equivalently reduce wire resistance. With this structure, it is possible to prevent degradation of amplitude of the clock pulses which are applied to the first and the second vertical charge transfer electrodes 26′a and 26′b.

Figure 4:
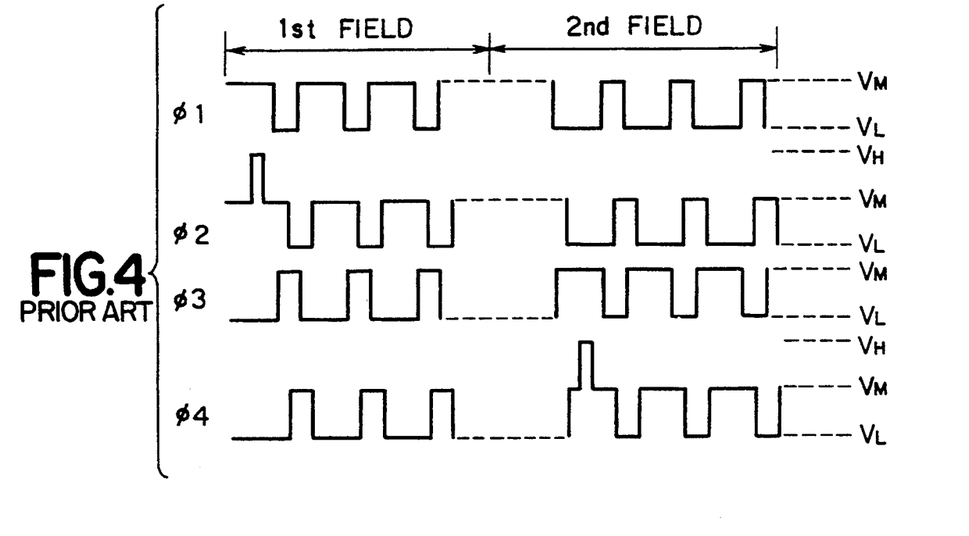
FIG. 4 shows waveforms of first through fourth clock pulse signals which are applied to first through fourth metal wires in the solid-state image pickup device.

Turning to FIG. 4, the conventional solid-state image pickup device is driven by applying the clock pulses of first through fourth clock pulse signals $\phi1$, $\phi2$, $\phi3$, and $\phi4$ shown in FIG. 4 to the first through the fourth metal wires 28′a to 28′d, respectively. As well known in the art, according to the NTSC system, a television signal has thirty frames per second. Each of the frames comprises first and second fields on the basis of interlaced scanning. Each of the first and the second fields has a time period equal to 1/60 second. The first and the second fields are also called odd and even fields, respectively. The first or the odd field is composed of picture elements in odd horizontal lines, namely, odd rows of the photoelectric converting sections 11 while the second or the even field is composed of picture elements in even horizontal lines, namely, even rows of the photoelectric converting sections 11. The first through the fourth clock pulse signals $\phi1$ to $\phi4$ are different in phase from one another. The first and the third clock signals $\phi1$ and $\phi3$ comprise vertical transferring clocks alone each of which is defined by low voltage $V_L$ and medium voltage $V_M$. The second and the fourth clock signals $\phi2$ and $\phi4$ comprise vertical transferring clocks and readout pulses each of which is defined by the medium voltage $V_M$ and high voltage $V_H$. The high voltage $V_H$ is, for example, a positive voltage of about 15 volts. The second clock signal $\phi2$ has one readout pulse in the first field while the fourth clock signal $\phi4$ has one readout pulse in the second field. The first and the third metal wires 28′a and 28′c act as transferring wires for supplying the vertical transferring clocks alone to the first vertical charge transfer electrodes 26′a. The second and the fourth metal wires 28′b and 28′d serve as reading/transferring wires for supplying the readout pulses and the vertical transferring clocks to the second vertical charge transfer electrodes 26′b.

In connection with this, the m sets of the first vertical charge transfer electrodes 26′a are classified into (m/2) odd sets corresponding to the odd field and (m/2) even sets corresponding to the even field. Similarly, the m sets of the second vertical charge transfer electrodes 26′b are classified into (m/2) odd sets corresponding to the odd field and (m/2) even sets corresponding to the even field.

Responsive to the readout pulse of the second clock pulse signal $\phi2$ in the first field, the (m/2) odd sets of the second vertical charge transfer electrode 26′b read the signal charges from (m/2) odd rows of the photoelectric converting sections 11 to the n vertical charge transfer regions or the n n-type semiconductor regions 23 as odd read charges. Responsive to the vertical transferring clocks of the first through the fourth clock pulse signals $\phi1$ to $\phi4$ in the first field, the n vertical charge transfer sections 12 (FIG. 1) transfer the odd read charges along the vertical direction as odd vertical transferred charges. The horizontal charge transfer section 13 (FIG. 1) receives the odd vertical transferred charges from the n vertical charge transfer sections 12 odd horizontal line by odd horizontal line as odd received charges to transfer the odd received charges along the horizontal direction as odd horizontal transferred charges. The output circuit section 14 (FIG. 1) receives the odd horizontal transferred charges to convert the odd horizontal transferred charges into the voltage signal composing the first field.

Likewise, responsive to the readout pulse of the fourth clock pulse signal $\phi4$ in the second field, the (m/2) even sets of the second vertical charge transfer electrode 26′b read the signal charges from (m/2) even rows of the photoelectric converting sections 11 to the n vertical charge transfer regions or the n n-type semiconductor regions 23 as even read charges. Responsive to the vertical transferring clocks of the first through the fourth clock pulse signals $\phi1$ to $\phi4$ in the second field, the n vertical charge transfer sections 12 (FIG. 1) transfer the even read charges along the vertical direction as even vertical transferred charges. The horizontal charge transfer section 13 (FIG. 1) receives the even vertical transferred charges from the n vertical charge transfer sections 12 even horizontal line by even horizontal line as even received charges to transfer the even received charges along the horizontal direction as even horizontal transferred charges. The output circuit section 14 (FIG. 1) receives the even horizontal transferred charges to convert the even horizontal transferred charges into the voltage signal composing the second field.

Figure 5A:
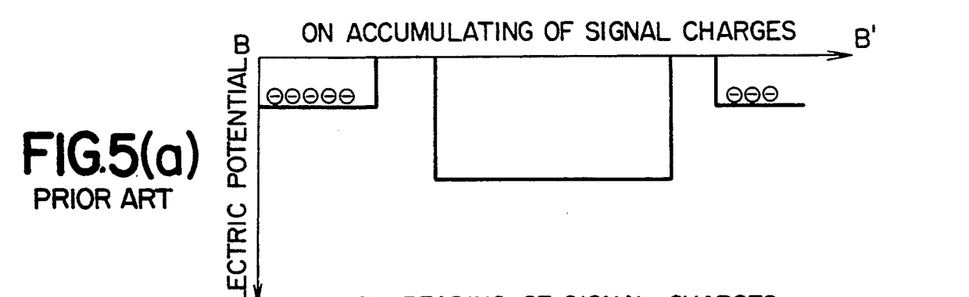
FIGS. 5(a) and (b) show electric potentials in cross-section of line B—B' in FIG. 2 on accumulating of signal charges and on reading of the signal charges, respectively.
Figure 5B:
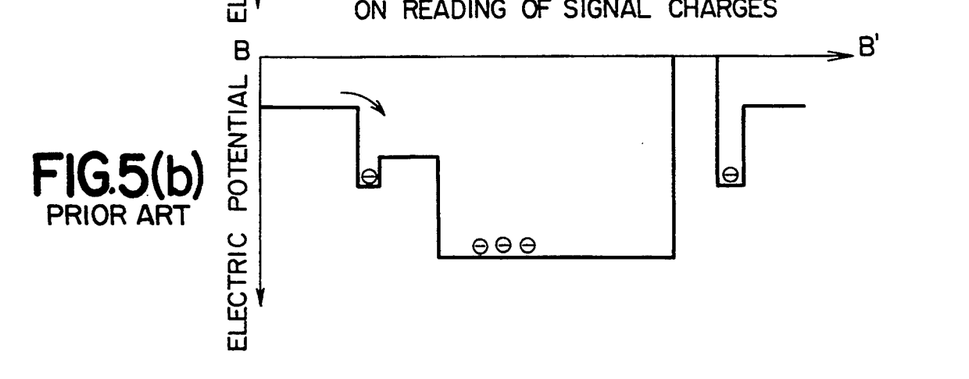

Referring to FIGS. 5(a) and (b), description will proceed to operation on accumulating of the signal charges and on reading of the signal charges in the conventional solid-state image pickup device. FIG. 5(a) shows an electric potential in cross-section of line B—B′ in FIG. 2 on accumulating of the signal charges. FIG. 5(b) shows an electric potential in cross-section of line B—B′ in FIG. 2 on reading of the signal charges.

Inasmuch as the (n/4) group of the first through the fourth metal wires 26′a to 26′d serve as the light-shield films for shielding the n vertical charge transfer sections 12 from the incident light, they extend on the photoelectric converting sections 11 with passing the m sets of the second vertical charge transfer electrodes 26′b as shown in FIG. 3B. As a result, when the m sets of the second vertical charge transfer electrodes 26′b are supplied with the readout pulses of the high voltage $V_H$ through the (n/4) groups of the second and the fourth metal wires 28′b and 28′d, the p+-type semiconductor regions 22 deplete at areas where the (n/4) groups of the second and the fourth metal wires 28′b and 28′d overlap with the photoelectric converting sections 11 to form a local potential well as shown in FIG. 5(b). As a result, a readout characteristic of the signal charges degrades.

For coping with this, the overlapped areas between the second and the fourth metal wires 28′b and 28′d and the photoelectric converting sections 11 are narrowed to minimize the local potential well formed in the overlapped areas. However, under the circumstances, a smear characteristic degrades by increasing of spurious signal charges flowing in the n vertical charge transfer sections 12.

In addition, in the conventional solid-state image pickup device, it is necessary to connect the cluster of the n first transfer electrode elements 26′a-1 of the first vertical charge transfer electrode 26′a by the first connecting electrode line 26′a-2 thereof and to connect the cluster of the n second transfer electrode elements 26′b-1 of the second vertical charge transfer electrode 26′b by the second connecting electrode line 26′a-2 thereof. As a result, the first connecting electrode line 26′a-2 of the first vertical charge transfer electrode 26′a and the second connecting electrode line 26′a-2 of the second vertical charge transfer electrode 26′b must be laminated to each other. Accordingly, large capacitance is formed between the first vertical charge transfer electrode 26′a and the second vertical charge transfer electrode 26′b. In addition, capacitance is also formed between the n-type semiconductor substrate 19 and the first vertical charge transfer electrode 26'a at an area where the first connecting line 26'a-2 of the first vertical charge transfer electrode 26'a is laminated to the second connecting line 26'a-2 of the second vertical charge transfer electrode 26'b. As a result, each of the clock pulses has a blunt waveform to degrade a transfer characteristic.

Figure 6:
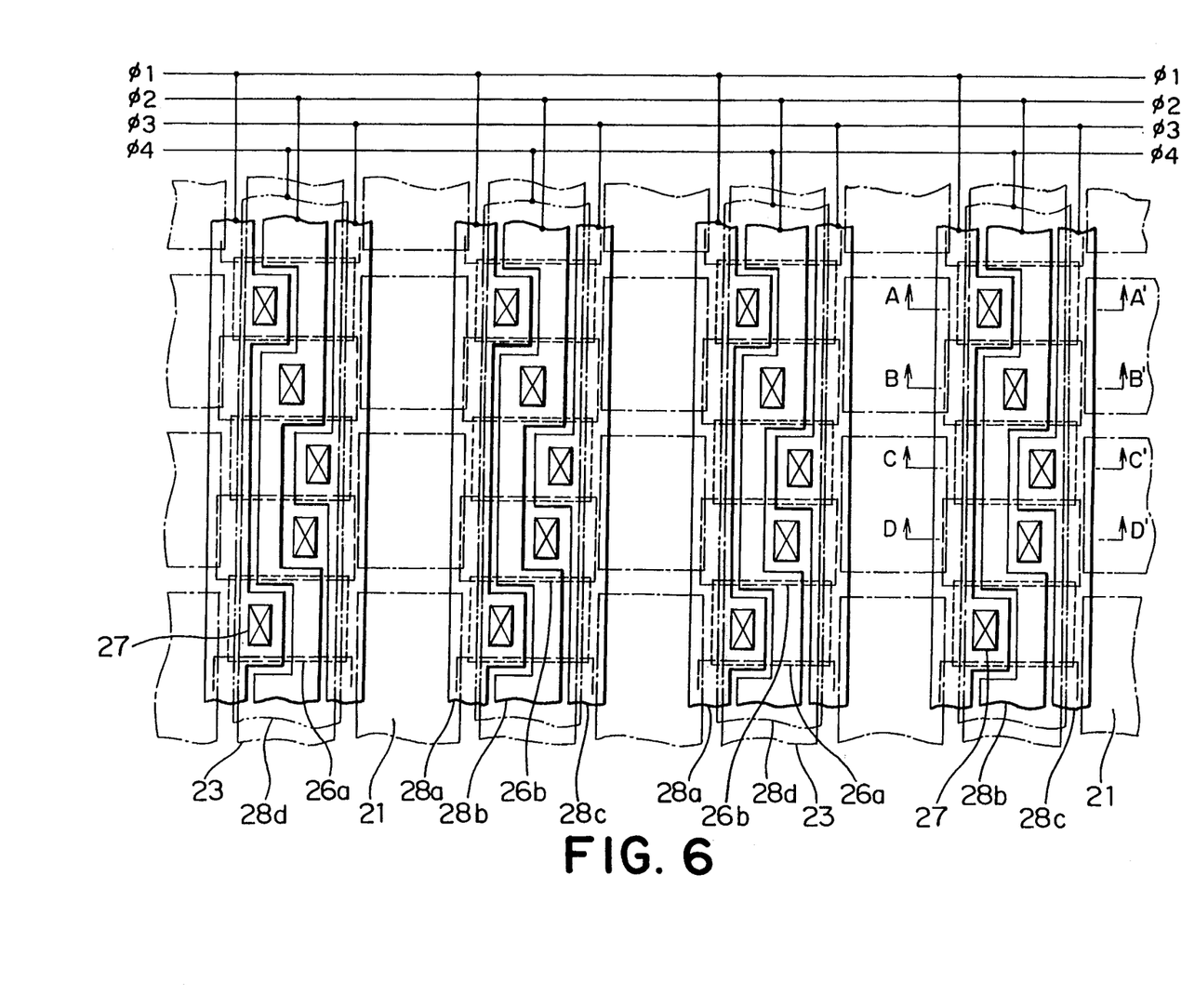
FIG. 6 is a plan view showing a part of a solid-state image pickup device according to a first embodiment of this invention that is the portion enclosed with the dash line in FIG. 1.
Figure 7A:
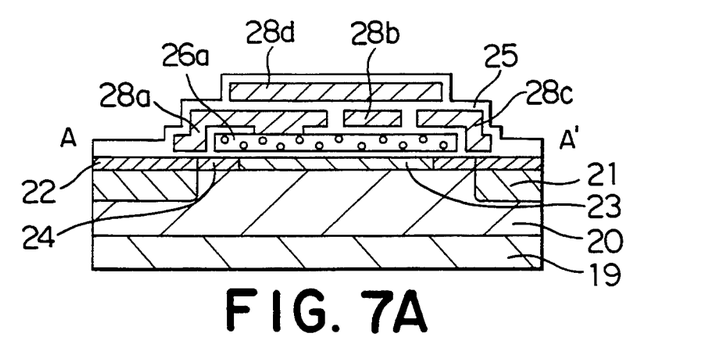
FIGS. 7A through 7D are cross-sectional views along line A—A', line B—B', line C—C', and line D—D' in FIG. 6, respectively.
Figure 7B:
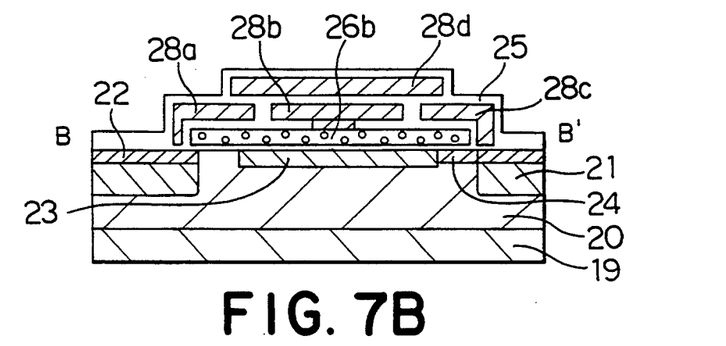
Figure 7C:
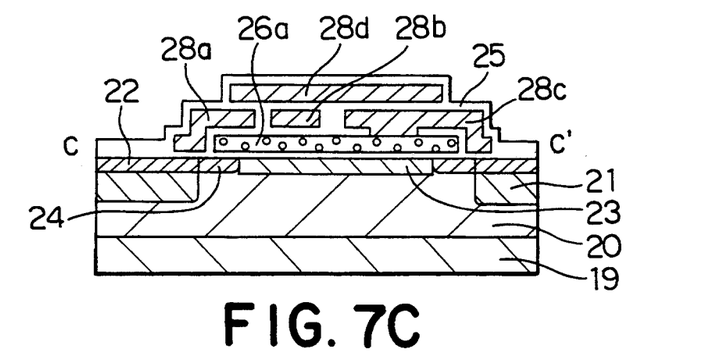
Figure 7D:
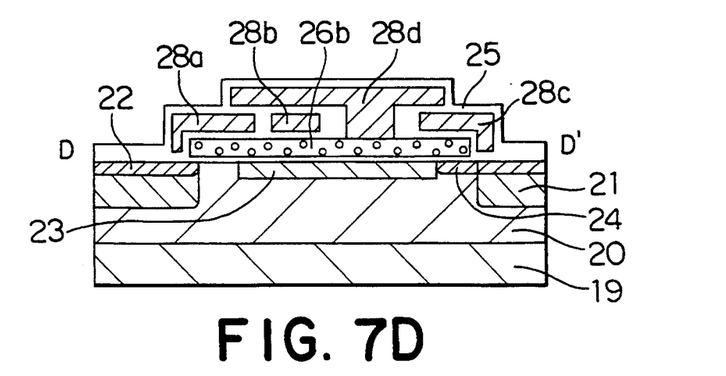

Referring to FIG. 6 and FIGS. 7A, 7B, 7C, and 7D, the description will proceed to a solid-state image pickup device according to a first embodiment of this invention. The device is of four phase driving type and is of an interline transfer type. FIG. 6 shows a portion enclosed with the dash line in FIG. 1. FIGS. 7A through 7D are cross-sectional views along line A—A', line B—B', line C—C', and line D—D' in FIG. 6, respectively.

As shown in FIGS. 7A to 7D, the solid-state image pickup device comprises the n-type semiconductor substrate 19. The n-type semiconductor substrate 19 is prepared in a known manner and has the principal surface which is directed upwards of FIGS. 7A to 7D. On the principal surface of the n-type semiconductor substrate 19, the p-type well layer 20 having the surface area is formed. In the surface area of the p-type well layer 20, the m by n n-type semiconductor regions 21, the m by n p+-type semiconductor regions 22, the n n-type semiconductor regions 23, and the p+-type semiconductor regions 24 are formed. The m by n n-type semiconductor regions 21 and the m by n p+-type semiconductor regions 22 collectively act as the m by n photoelectric converting sections 11 (FIG. 1). The n n-type semiconductor regions 23 serve as the n vertical charge transfer regions of the n vertical charge transfer sections 12 (FIG. 1). The p+-type semiconductor regions 24 are composed of the element isolation sections 15 (FIG. 1). As shown in FIGS. 7A to 7D, the n-type semiconductor regions 23 are surrounded with the p+-type semiconductor regions 24 and/or the surface area of the p-type well layer 20.

As shown in FIG. 6, over the surface area of the p-type well layer 20, over the m by n p+-type semiconductor regions 22, over the n n-type semiconductor regions 23, and over the p+-type semiconductor regions 24, m by n sets of first and second vertical charge transfer electrodes 26a and 26b and n groups of first, second, third, and fourth metal wires 28a, 28b, 28c, and 28d are formed through the insulation film 25. The n n-type semiconductor regions 23 are formed beneath the m by n sets of the first and the second vertical charge transfer electrodes 26a and 26b. The m by n sets of the first and the second vertical charge transfer electrodes 26a and 26b are made of polycrystalline silicon and composed of the vertical charge transfer electrodes of the n vertical charge transfer sections 12 (FIG. 1). The n groups of the first through the fourth metal wires 28a to 28d supply the clock pulses to the m by n sets of the first and the second vertical charge transfer electrodes 26a and 26b. The n groups of the first through the fourth metal wires 28a to 28d serve as light-shield films for shielding the n vertical charge transfer sections 12 (FIG. 1) from the incident light. The first through the fourth metal wires 28a to 28d are collectively called a power feeding section. In other words, the power feeding section is divided into the first through the fourth metal wires 28a to 28d.

As shown in FIGS. 7A to 7D, each of the first vertical charge transfer electrodes 26a is apart from the corresponding photoelectric converting section 11 in the horizontal direction while each of the second vertical transfer electrode 26b extends near the corresponding photoelectric converting section 11 in the horizontal direction.

As shown in FIG. 6, the n groups of the first through the fourth metal wires 28a to 28d are formed on the respective n vertical charge transfer sections 12. The n groups of the first and the third metal wires 28a and 28c are alternately connected to the m by n sets of the first vertical charge transfer electrodes 26a through contact holes 27. The n groups of the second and the fourth metal wires 28b and 28d are alternately connected to the m by n sets of the second vertical charge transfer electrodes 26a through contact holes 27.

As shown in FIGS. 7A to 7D, the first through the third metal wires 28a to 28c are formed in a first layer of conductive film while the fourth metal wires 28d are formed in a second layer of conductive film. More specifically, the first through the third metal wires 28a to 28c are formed on the respective vertical charge transfer sections 12 at left-hand side, central portion, and right-hand side thereof. The first and the third metal wires 28a to 28c are formed with being overlapped with the photoelectric converting sections 11 while the second and the fourth metal wires 28b and 28d are formed without being overlapped with the photoelectric converting sections 11. In other words, the first and the third metal wires 28a to 28c only shield areas between the photoelectric converting sections 11 and the vertical charge transfer sections 12 from the incident light.

Turning to FIG. 4 in addition to FIG. 6, the first through the fourth metal wires 28a to 28d are applied with the clock pulses of the first through the fourth clock pulse signals $\phi 1$ to $\phi 4$ shown in FIG. 4, respectively. The first and the third metal wires 28a and 28c act as transferring wires for supplying the vertical transferring clocks alone to the first vertical charge transfer electrodes 26a. The second and the fourth metal wires 28b and 28d serve as reading/transferring wires for supplying the readout pulses and the vertical transferring clocks to the second vertical charge transfer electrodes 26b. The m by n sets of the first vertical charge transfer electrodes 26a are classified into (m/2) by n odd sets and (m/2) by n even sets. Similarly, the m by n sets of the second vertical charge transfer electrodes 26b are classified into (m/2) by n odd sets and (m/2) by n even sets.

Responsive to the readout pulse of the second clock pulse signal $\phi 2$ in the first field, the (m/2) by n odd sets of the second vertical charge transfer electrodes 26b read the signal charges from the (m/2) odd rows of the photoelectric converting sections 11 (FIG. 1) to the respective n-type semiconductor regions 23 as odd read charges. Responsive to the vertical transferring clocks of the first through the fourth clock pulse signals $\phi 1$ to $\phi 4$ in the first field, the n vertical charge transfer sections 12 (FIG. 1) transfer the odd read charges along the vertical direction as odd vertical transferred charges. The horizontal charge transfer section 13 (FIG. 1) receives the odd vertical transferred charges from the n vertical charge transfer sections 12 odd horizontal line by odd horizontal line as odd received charges to transfer the odd received charges along the horizontal direction as odd horizontal transferred charges. The output circuit section 14 (FIG. 1) receives the odd horizontal transferred charges into the voltage signal composing the first field.

Likewise, responsive to the readout pulse of the fourth clock signal $\phi 4$ in the second field, the (m/2) by n even sets of the second vertical charge transfer electrodes 26b read the signal charges from the (m/2) odd rows of the photoelectric converting sections 11 to the respective n-type semiconductor regions 23 as even read charges. Responsive to the vertical transferring clocks of the first through the fourth clock pulse signals $\phi 1$ to $\phi 4$ in the second field, the n vertical charge transfer sections 12 (FIG. 1) transfer the even read charges along the vertical direction as even vertical transferred charges. The horizontal charge transfer section 13 (FIG. 1) receives the even vertical transferred charges from the n vertical charge transfer sections 12 even horizontal line by even horizontal line as even received charges to transfer the even received charges along the horizontal direction as even horizontal transferred charges. The output circuit section 14 (FIG. 1) receives the even horizontal transferred charges into the voltage signal composing the second field.

Figure 8A:
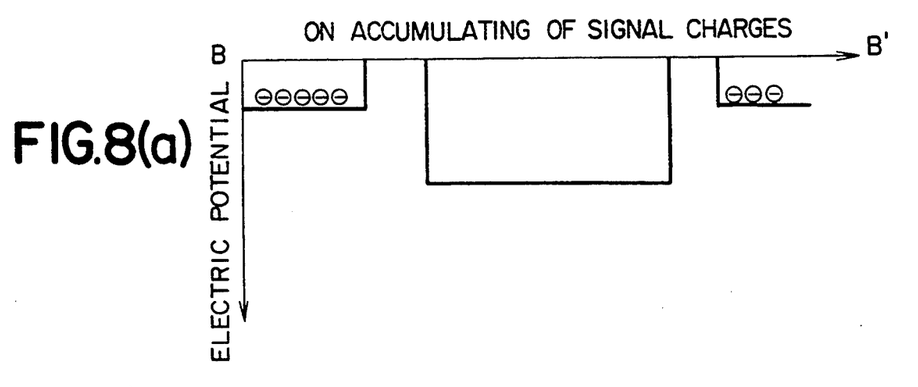
FIGS. 8(a) and (b) show electric potentials in cross-section of line B—B' in FIG. 6 on accumulating of signal charges and on reading of the signal charges, respectively.
Figure 8B:
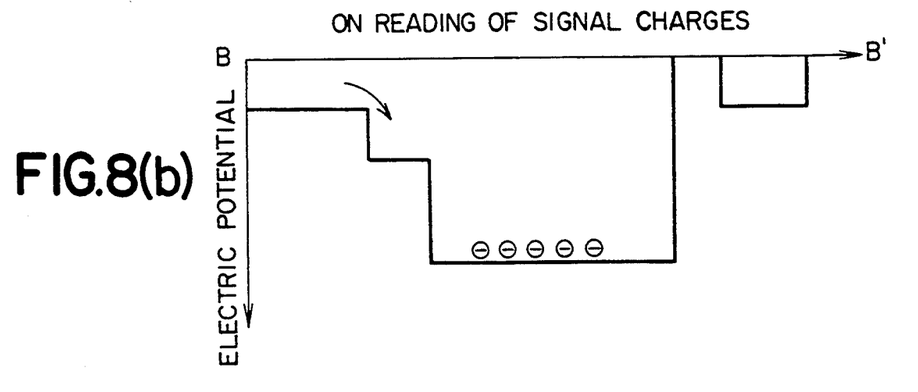

Referring to FIGS. 8(a) and (b), description will proceed to operation on accumulating of the signal charges and on reading of the signal charges in the solid-state image pickup device illustrated in FIG. 6. FIG. 8(a) shows electric potential in cross-section of line B—B' in FIG. 6 on accumulating of the signal charges. FIG. 8(b) shows electric potential in cross-section of line B—B' in FIG. 6 on reading of the signal charges.

In the solid-state image pickup device illustrated in FIG. 6, the second and the fourth metal wires 28b and 28d, which are applied with the second and the fourth clock pulse signals $\phi 2$ and $\phi 4$ having the readout pulse of the high positive voltage $V_H$, have no overlapping sections with the photoelectric converting sections 11 and the first and the third metal wires 28a and 28c having the overlapping sections with the photoelectric converting sections 11 are applied with the first and the third clock pulse signals $\phi 1$ and $\phi 3$ having only the vertical transferring clocks of the medium voltage $V_M$. As a result, on reading of the signal charges, as shown in FIG. 8(b), the p+-type semiconductor regions 22 of the photoelectric converting sections 11 do not deplete and it is therefore possible to prevent occurrence of the local potential well which is in trouble over prior art. According to the solid-state image pickup device illustrated in FIG. 6, it is possible to improve the reading characteristic for the signal charges from the m by n photoelectric converting sections 11 to the n vertical charge transfer sections 12.

In addition, inasmuch as the first and the second vertical charge transfer electrodes 26a and 26b in the vertical charge transfer sections 12 are supplied with the clock pulses from the first through the fourth metal wires 28a to 28d which are disposed for each vertical charge transfer section, it is unnecessary to form connecting electrode lines for connecting transfer electrode elements of the first and the second vertical charge transfer electrodes in the horizontal direction as the conventional solid-state image pickup device. As a result, it is possible to obtain an about 15% improvement in sensitivity in comparison with the conventional solid-state image pickup device because the photoelectric converting sections 11 can be formed in wide areas. Inasmuch as the connecting electrode lines between the vertical charge transfer electrodes are eliminated, it is possible not only to cut capacitance between the first and the second vertical charge transfer electrodes 26a and 26b by about 50% but also to cut capacitance between the first vertical charge transfer electrodes 26a and the n-type semiconductor substrate 19 by about 30%.

Figure 9:
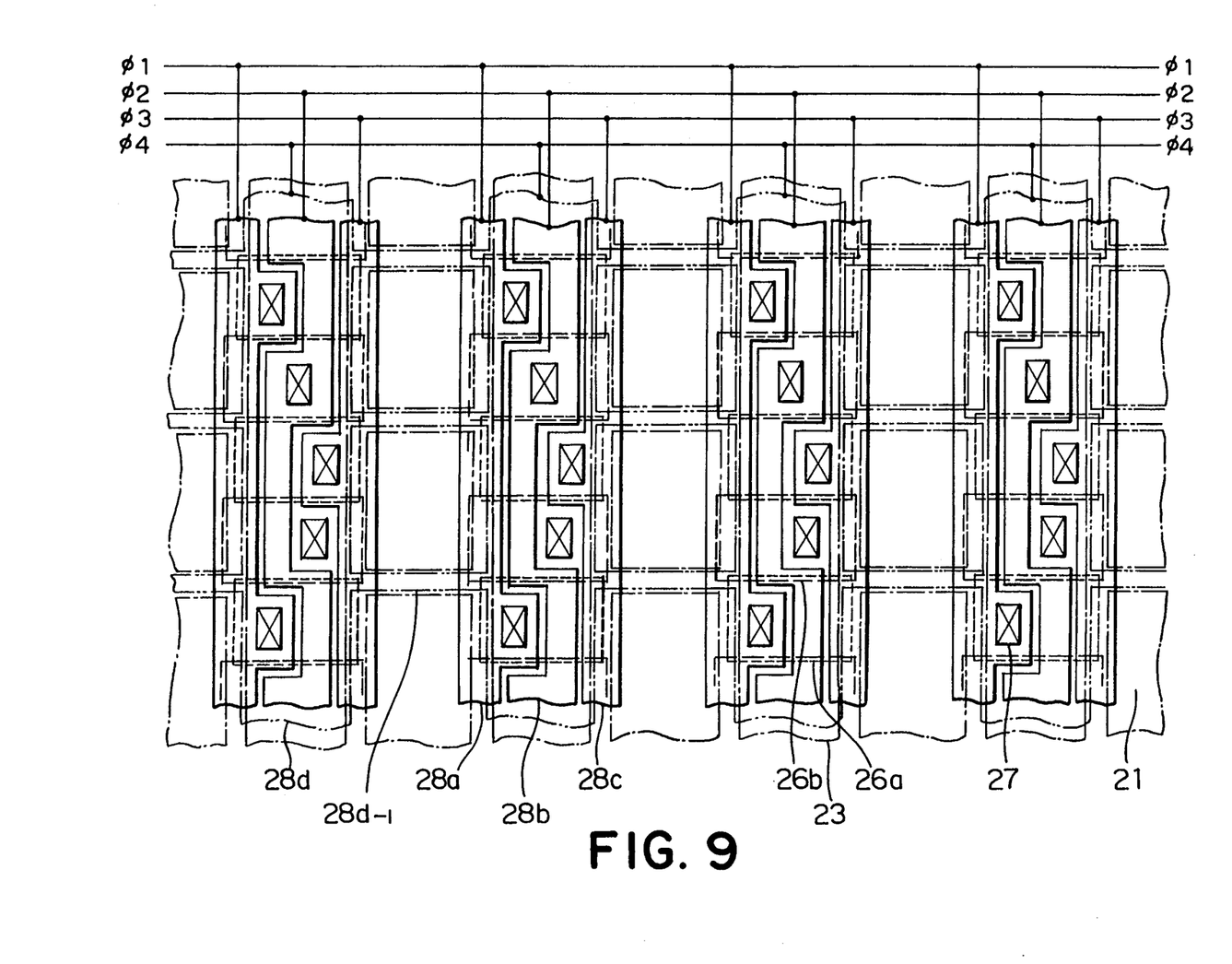
FIG. 9 is a plan view showing a part of a solid-state image pickup device according to a second embodiment of this invention that is the portion enclosed with the dash line in FIG. 1.

Referring to FIG. 9, the description will proceed to a solid-state image pickup device according to a second embodiment of this invention. FIG. 9 shows a portion enclosed with the dash line in FIG. 1. The illustrated solid-state image pickup device is similar to that illustrated in FIG. 6 except that the fourth metal wires 28d are connected with one another by connecting metal wires 28d-1.

The connecting metal wires 28d-1 shield the horizontal spaces between the adjacent photoelectric converting sections 11 in the vertical direction from the incident light. Inasmuch as the second layer of the conductive film includes only the fourth metal wires 28d and is for transmitting the same clock pulse voltage between the adjacent vertical charge transfer sections 12, it is possible to connect the fourth metal wires 28d with each other by the connecting metal wires 28d-1 between the photoelectric converting sections 11 in the vertical direction. According to the connecting metal wires 28d-1, it is possible to carry out light-shield of the horizontal spaces between the photoelectric converting sections 11 and to improve the smear characteristic in comparison with both the conventional solid-state image pickup device illustrated in FIG. 2 and the solid-state image pickup device illustrated in FIG. 6.

Figure 10:
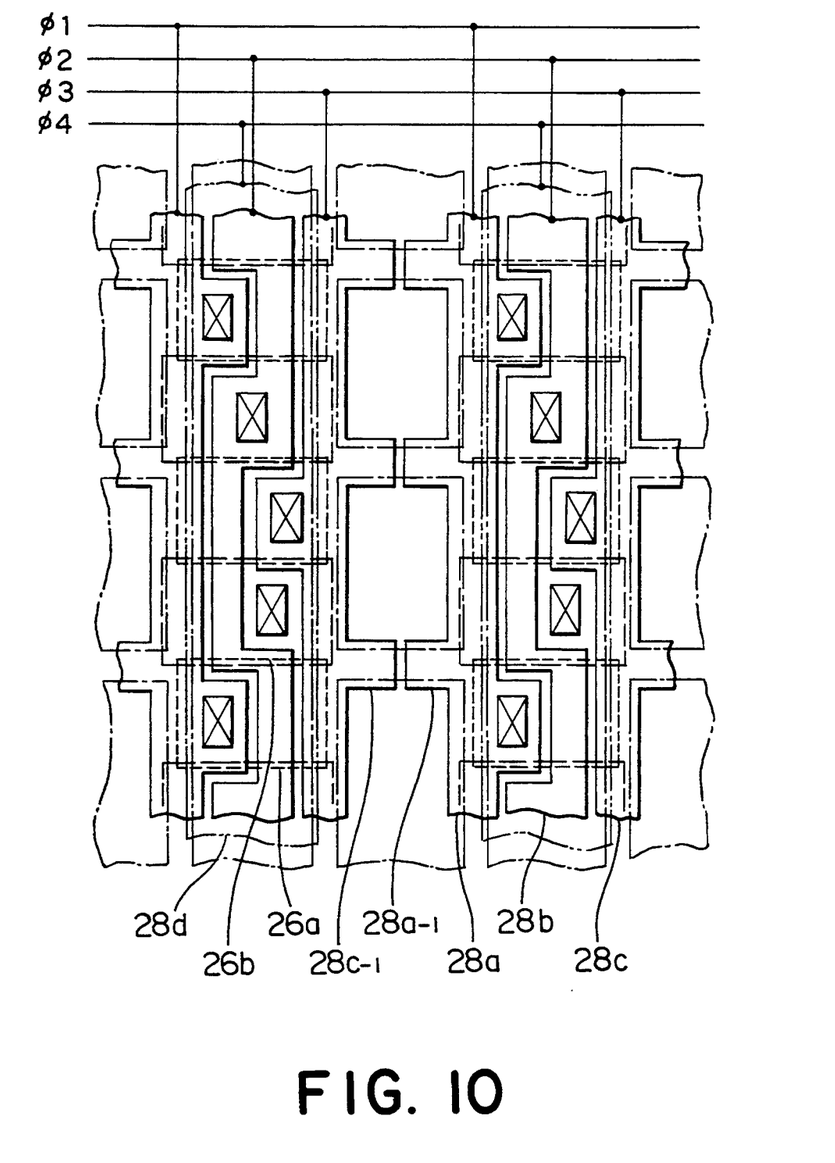
FIG. 10 is a plan view showing a part of a solid-state image pickup device according to a third embodiment of this invention that is a half of the portion enclosed with the dash line in FIG. 1.

Referring to FIG. 10, the description will proceed to a solid-state image pickup device according to a third embodiment of this invention. FIG. 10 shows a half of a portion enclosed with the dash line in FIG. 1. The illustrated solid-state image pickup device is similar to that illustrated in FIG. 6 except that the first and the third metal wires 28a and 28c comprise first and second tongue portions 28a-1 and 28c-1 which extend to the horizontal spaces between the adjacent photoelectric converting sections 11 in the vertical direction and which carry out the light-shield of the horizontal spaces between the adjacent photoelectric converting sections 11 in the vertical direction. Inasmuch as the light-shield of the areas between the adjacent photoelectric converting sections 11 is carried out by the first and the third metal wires 28a and 28c for transmitting only the vertical transferring clock pulses each having the medium voltage $V_M$, the local potential well is not formed in the photoelectric converting sections 11 although the first and the third metal wires 28a and 28c are formed with being overlapped with the photoelectric converting sections 11. As a result, it is possible to improve the smear characteristic without degradation of the charge reading characteristic.

While this invention has thus far been described in conjunction with a few embodiments thereof, it will now be readily possible for those skilled in the art to put this invention into practice in various other manners. For example, this invention can be applied to solid-state image pickup devices of driving type except for four phase or those of surface channel type. In addition, the transfer electrodes may be made of one layer of polysilicon or three or more layers of polysilicon. Furthermore, all or a part (for example, only the first layer of the power feeding wires) of the power feeding wires may be formed by a high-melting point metal having a high light-shield characteristic or silicide thereof.

What is claimed is:

1. A solid-state image pickup device comprising:

a plurality of photoelectric converting sections, arranged in the configuration of a matrix with m rows and n columns, for accumulating, in response to incident light, electric charges as signal charges where m and n represent first and second positive integers each of which is not less than two;

n vertical charge transfer sections each adjacent to a respective one of the n columns of said photoelectric converting sections at a same directional side thereof, each of said n vertical charge transfer sections extending along a vertical direction, said n vertical charge transfer sections being for reading the signal charges out of said photoelectric converting sections as read charges to transfer the read charges along the vertical direction as transferred charges, each of said n vertical charge transfer sections comprising a plurality of vertical charge transfer electrodes and a vertical charge transfer region formed beneath the vertical charge transfer electrodes;

n transferring wires, which are disposed on said n vertical charge transfer sections, respectively, and which serve as light-shield films for shielding said n vertical charge transfer sections from the incident light, for supplying vertical transferring clocks to said vertical charge transfer electrodes to make said n vertical charge transfer sections transfer to read charges along the vertical direction as the transferred charges, said n transferring wires light-shielding areas between said photoelectric converting sections and said vertical charge transfer regions, each of said n transferring wires comprising two metal wires; and n reading/transferring wires, which are disposed on said n vertical charge transfer sections, respectively, and which serve as light-shield films for shielding said n vertical charge transfer sections from the incident light, for supplying readout pulses and vertical transferring clocks to said vertical charge transfer electrodes to make said n vertical charge transfer sections read the signal charges from said photoelectric converting sections to the vertical charge transfer regions as the read charges and to make said n vertical charge transfer sections transfer the read charges along the vertical direction as the transferred charges, each of said n reading/transferring wires comprising two metal wires.

2. A solid-state image pickup device as claimed in claim 1, wherein both said n transferring wires and said n reading/transferring wires are composed of first and second layers of conductive films, said n transferring wires being formed in the first layer of the conductive film.

3. A solid-state image pickup device as claimed in claim 2, wherein said n reading/transferring wires, which are formed in the second layer of the conductive film, extend on areas between said photoelectric converting sections in the vertical direction.

4. A solid-state image pickup device as claimed in claim 1, wherein said n transferring wires extend on areas between said photoelectric converting sections in the vertical direction.

5. A solid-state image pickup device as claimed in claim 1, wherein at least one of said n transferring wires and said n reading/transferring wires is formed by high-melting point metal.

6. A solid-state image pickup device as claimed in claim 1, wherein at least one of said n transferring wires and said n reading/transferring wires is formed by a silicide film of high-melting point metal.

7. A solid-state image pickup device comprising:
a plurality of photoelectric converting sections, arranged in the configuration of a matrix with m rows and n columns, for accumulating, in response to incident light, electric charges as signal charges where m and n represent first and second positive integers each of which is not less than two;

n vertical charge transfer sections each adjacent to a respective one of the n columns of said photoelectric converting sections at a same directional side thereof, each of said n vertical charge transfer sections extending along a vertical direction, said n vertical charge transfer sections being for reading the signal charges out of said photoelectric converting sections as read charges to transfer the read charges along the vertical direction as transferred charges, each of said n vertical charge transfer sections comprising m clusters of first and second vertical charge transfer electrodes alternately arranged along the vertical direction and a vertical charge transfer region formed beneath the m clusters of the first and the second vertical charge transfer electrodes, the first vertical charge transfer electrodes being apart from the respective photoelectric converting sections in a horizontal direction, the second vertical charge transfer electrodes extending near the respective photoelectric converting sections in the horizontal direction; and n power feeding sections, which are disposed on said n vertical charge transfer sections, respectively, and which serve as light-shield films for shielding said n vertical charge transfer sections from the incident light, each of said n power feeding sections being composed of first and second layers of conductive films and being divided into first through fourth metal wires, the first through the third metal wires being formed in the first layer of the conductive film at left-hand side, central portion, and right-hand side in each of said n vertical charge transfer sections, the fourth metal wire being formed in the second layer of the conductive film, the first and the third metal wires being alternately connected to the first vertical charge transfer electrodes via contact holes, the second and the fourth metal wires being alternately connected to the second vertical charge transfer electrodes via contact holes, the first through the fourth metal wires being applied with first through fourth clock pulse signals, respectively, which are different in phase from one another, the first and the third clock pulse signals comprising vertical transferring clocks alone, the second and the fourth clock pulse signals comprising readout pulses and vertical transferring clocks, the first and the third metal wires only light-shielding areas between said photoelectric converting sections and said vertical charge transfer regions, the second and the fourth metal wires supplying the readout pulses to the second vertical charge transfer electrodes to make said n vertical charge transfer sections read the signal charges from said photoelectric converting sections to the vertical charge transfer regions as the read charges, the first through the fourth metal wires supplying the vertical transferring clocks to the first and the second vertical charge transfer electrodes to make said n vertical charge transfer sections transfer the read charges along the vertical direction as the transferred charges.

8. A solid-state image pickup device as claimed in claim 7, wherein said fourth metal wires are connected with one another by connecting metal wires for light-shielding horizontal spaces between the photoelectric converting sections in the vertical direction.

9. A solid-state image pickup device as claimed in claim 7, wherein said first and said third metal wires comprise tongue portions which extend to horizontal spaces between said photoelectric converting sections in the vertical direction, thereby carrying out light-shield of the horizontal spaces.

10. A solid-state image pickup device as claimed in claim 7, wherein at least one of the first through the fourth metal wires is formed by high-melting point metal.

11. A solid-state image pickup device as claimed in claim 7, wherein at least one of first through the fourth metal wires is formed by a silicide film of high-melting point metal.

* * * * *